(12) United States Patent
Thuis

(10) Patent No.: US 6,424,226 B1
(45) Date of Patent: Jul. 23, 2002

(54) TWO-PORT WITH A FREQUENCY-DEPENDENT NETWORK

(75) Inventor: Robbert Carel Thuis, Nijmegen (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/612,071

(22) Filed: Jul. 7, 2000

(30) Foreign Application Priority Data

Jul. 13, 1999 (EP) ............................................. 99202301

(51) Int. Cl.$^7$ ............................................. H03F 3/191
(52) U.S. Cl. ...................... 330/302; 330/294; 330/305
(58) Field of Search .................... 330/86, 109, 294, 330/302, 303, 305, 306

(56) References Cited

U.S. PATENT DOCUMENTS 5,592,122 A * 1/1997 Masahiro et al. ........ 330/302 X
5,805,023 A * 9/1998 Fukuden ..................... 330/302
6,166,599 A * 12/2000 Aparin et al. ............ 330/302 X

FOREIGN PATENT DOCUMENTS

WO WO9625791 8/1996 ............. H03F/1/32

OTHER PUBLICATIONS

Patent Abstract of Japan: JP 07 022849 A, Publication Date: Jan. 24, 1995, Application Date: Jun. 30, 1993, Application No.: 05189189, Int'l Class: H03F 1/02.

* cited by examiner

Primary Examiner—Steven J. Mottola
(74) Attorney, Agent, or Firm—Theodorus N. Mak

(57) ABSTRACT

RF amplifiers used in communications systems exhibit backward intermodulation caused by non-linear amplification. Backward intermodulation of the transmit signal and an external signal, which reaches the output of the amplifier through the antenna, results in an unwanted third-order intermodulation product that potentially interferes with the proper reception of the receive signal. The receive sensitivity of the communications system is adversely affected by this unwanted third-order intermodulation product. By mixing a second-order intermodulation component, caused by the same backward intermodulation, with the transmit signal, a compensation signal is created allowing the cancellation of the unwanted third-order intermodulation component.

17 Claims, 3 Drawing Sheets

TWO-PORT WITH A FREQUENCY-DEPENDENT NETWORK

BACKGROUND OF THE INVENTION

1. Field of the Invention

The invention relates to a signal processing system comprising an output circuit that is tuned to a first frequency, an output of which circuit being connected to an input of a two-port having non-linear amplification, and a frequency-selective external network, an output of the two-port being connected to an input of an input circuit that is tuned to a second frequency.

The invention further relates to a communications system arranged for processing signals in different frequency channels with a predetermined channel spacing, comprising, in succession, an output circuit that is tuned to a channel frequency an output of which being connected to an input of a two-port having non-linear amplification, and a frequency-selective external network, an output of the two-port being connected to an input of an input circuit that is tuned to a second frequency.

Systems of this type are known from the AMPS standard for mobile telecommunication, the two-port having the form of an output amplifier. With the known arrangements it is not very well possible to satisfy the requirements as to reception sensitivity made by the network managers when there is an external interference signal.

If a first and a second signal are available on a two-port that has non-linear amplification, intermodulation signals will arise due to this non-linear amplification. These intermodulation signals appear on the output of the two-port. If the spacing between the first frequency and the second frequency is equal to the spacing between the transmitting frequency of the system and the receiving frequency of the system, an intermodulation component will arise that is exactly equal to the receiving frequency. As a result, the signal-to-noise ratio of the received signal is reduced.

If either of the two signals available on the input of the two-port arrives via an internal feedback from the output to the input, a similar effect will arise. This effect is called Backward Intermodulation.

2. Description of the Related Art

A method of reducing specific components of intermodulation distortion is known from WO 96/25791 Moazzan et al. When two input signals available on the input of a two-port and, having a frequency F1 and F2 respectively, are amplified by a non-linear amplifier, an unwanted third-order IM product having frequency $2*F1-F2$ will arise. The signals and IM products will further be referenced by their frequencies. By mixing the second-order distortion component $2*F1$ of either of the input signals with the other input signal F2, a new mixed product will arise having a frequency equal to $2*F1-F2$. This mixed product $2*F1-F2$ is added to the originally unwanted third-order IM product and, with suitable amplitude and phase, compensates for the unwanted third-order IM product. A disadvantage of this method is that both signals must be present on the input and that the second-order distortion component has a frequency that is twice as high as the system frequency, so that the correct amplitude and phase of the correction signal are hard to control. Furthermore, the transistor and associated adaptation networks are also to work at a frequency that is twice as high as the system frequency.

With an input signal F1 having a frequency of, for example, 1800 MHz, and an input signal F2 having a frequency of, for example, 1755 MHz, a third-order IM product will arise at $2*1800-1755=1845$ MHz. The second harmonic distortion component lies at $2*1800=3600$ MHz. If the frequency of input signal F1 of 1755 MHz is mixed with this, a mixed product will arise having a frequency of $3600-1755=1845$ MHz. This frequency is equal to the frequency of the third-order IM product. With anti-phase and equal amplitude relative to the unwanted third-order IM product, a reduction of this third-order IM product is possible.

SUMMARY OF THE INVENTION

It is an object of the invention to minimize the influence of the external interference signal on the receiving sensitivity by compensating a third-order IM product developed in the two-port in a manner that does not have the above identified disadvantages.

For this purpose, the system according to the invention is characterized in that the external network is tuned to a difference frequency between the first frequency and the second frequency and is connected at least to the input of the two-port and to the output of the two-port.

The invention is based on the following recognition:

Besides the unwanted third-order IM product $2*F1-F2$, from a first input signal having frequency F1 and a second input signal having frequency F2, with intermodulation as a result of the non-linear amplification of the two-port, also a second-order IM product F1–F2 rises having a relatively low frequency. After this second-order IM product has been fed back and mixed with the input signal F1, inter alia the signal $F1+(F1-F2)$ arises which, provided that a suitable choice of phase and amplitude is made, is capable of reducing the unwanted third-order IM product $2*F1-F2$. As a result of the relatively low frequency of F1–F2, the phase and amplitude control becomes considerably simpler.

With a frequency of the first input signal F1 of, for example, 1800 MHz and of the second input signal F2 of, for example, 1755 MHz, a third-order IM product arises at $2*1800-1755=1845$ MHz. If the receiving frequency is also 1845 MHz, the receiving sensitivity of the signal processing system is reduced. A second-order IM product F1–F2 lies at $1800-1755=45$ MHz. If this 45 MHz signal is mixed with the first transmit signal F1 of 1800 MHz, there will also be $1800+45=1845$ MHz, which is the frequency of the third-order IM product. If this signal is in anti-phase and has equal amplitude to the unwanted third-order IM product, a reduction of the unwanted signal is possible.

In the case of a communications system, the difference between the transmitting frequency and the receiving frequency is the channel spacing, while a similar effect may be obtained if the second-order IM product used for compensation lies at a frequency equal to the channel spacing. In the above example the transmitting frequency F1 is, for example, 1800 MHz, the second input signal F2, for example, 1755 MHz and the receiving frequency of a nearby receiver, for example, 1845 MHz. The amplified third-order IM product, also at 1845 MHz, is radiated by the antenna and may reduce the receiving sensitivity of a nearby receiver. With the aid of the same measures as with the signal processing system, the third-order IM product may be reduced, so that a reduction of the receiving sensitivity of a nearby receiver is avoided.

In a first embodiment of the signal processing system according to the invention, two signals F1 and F2 are present on the input of the two-port. The resulting second-order IM product F1–F2 on the output of the two-port is frequency-selectively applied with the correct phase and amplitude from the two-port output to the two-port input through the external network, at which input the product is mixed with the transmit signal F1 by means of the non-linear amplification of the two-port. The resulting new mixed product F1+(F1−F2)=2*F1−F2 has, when the external network is suitably selected, exactly the same amplitude, but an opposite phase to the unwanted third-order IM product 2*F1−F2. When the two signals are added together, the unwanted third-order IM product is compensated for. Since the external network is frequency-selective, mainly the second-order IM product is present on the input of the two-port, whereas the original input signals are fed back the least possible from the output to the input.

In a further embodiment of the signal processing system according to the invention, in which the two-port comprises an internal feedback, the input signal F2 is not present on the input of the two-port, but on the output of the two-port. This signal F2 gives rise to backward intermodulation because, as a result of the internal feedback, it reaches the input where the signal F1 is already available. As a result of intermodulation of the signals F2 and F1, due to the non-linear amplification, unwanted intermodulation products arise. From this point on, a similar compensation to that described in the first embodiment is possible.

In a further embodiment of the signal processing system according to the invention, in which the external network has a frequency-dependent impedance between the output of the two-port and the input of the two-port, this frequency-dependent impedance forms a lower impedance for the second-order IM product F1−F2 than for the signals F1 and F2. This causes the feedback of F1−F2 to be stronger than for F1 and F2, so that the amplification of F1 and F2 is affected only minimally. The second-order IM product F1−F2 is then used in similar fashion to that of the first embodiment to compensate for the third-order IM product 2*F1−F2 by means of intermodulation, phase shifting and amplitude matching.

In a further embodiment of the signal processing system according to the invention, in which the external network has a frequency-dependent impedance between the input of the two-port and a terminal having reference potential, the frequency selectivity of the feedback is determined by the frequency-dependent impedance. As this impedance forms a higher impedance for the second-order IM product F1−F2 than for the signals having the frequencies F1 and F2, the signals having the frequencies F1 and F2 in the feedback signal are attenuated more than the second-order IM product F1−F2. As a result, the amplification of F1 and F2 is affected minimally, whereas the second-order IM product is still available on the input and can be used as in the first embodiment to compensate for the third-order IM product. The external network as a whole provides a suitable phase and amplitude of the second-order IM product.

In a further embodiment of the signal processing system according to the invention, in which the two-port as described in the previous embodiment also includes a bipolar transistor, the frequency-selective impedance is used in a different manner. Again the second-order IM product F1−F2 is used to compensate for the third-order IM product 2*F1−F2. At the frequency of the second-order IM product the frequency-dependent impedance connected between the input of the two-port and a reference potential has a lower impedance than at the transmitting frequency F1 and also a lower impedance than the output impedance of the output circuit. This makes for increased amplitude of the base current of the second-order IM product F1−F2 relative to the other signal components present. The resulting second-order IM product, after being amplified by the bipolar transistor, is fed back by the external network from the output to the input of the two-port together with the other signals present in the two-port. As the second-order IM product in this feedback signal is amplified relative to the other signals present, in effect a frequency-selective feedback is obtained. Since the feedback, together with the base-connected series LC circuit, provides that the second-order IM product F1−F2 having the right phase and amplitude is available on the base, it is possible with the resulting mixing product of the second-order IM product F2−F1 and the send signal F1 to compensate for the third-order IM signal component 2*F1−F2.

BRIEF DESCRIPTION OF THE DRAWINGS

The invention will be further explained with reference to the drawings described hereinafter.

In the drawings.

DETAILED DESCRIPTION OF THE INVENTION

Figure 1:
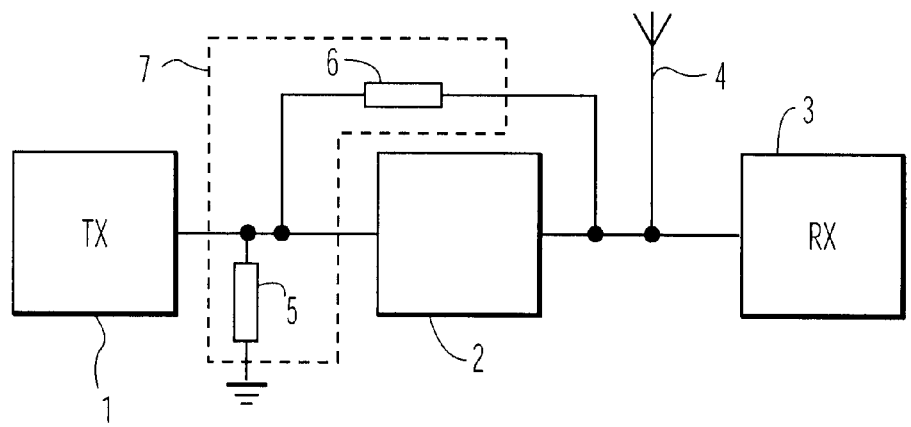
FIG. 1 diagrammatically shows a signal processing system according to the invention.

FIG. 1 diagrammatically shows a signal processing system according to the invention.

The system comprises a transmitting part 1 whose output is connected to the input of a two-port 2. The output of the two-port 2 is further connected to the input of a receiving part 3 and an antenna 4.

The antenna 4 is used both as a transmitting and as a receiving antenna. External signals are led to the receiver 3 via this antenna 4.

An external network 7 comprising frequency-dependent impedances 5 and 6 is connected also to both the input and the output of the two-port.

The signals having frequencies F1 and F2 applied by the transmitting part 1 to the two-port 2 to be amplified thereby result in an unwanted third-order IM product having frequency 2*F1−F2 on the output of the two-port 2, caused by the intermodulation, since the two-port 2 has non-linear amplification. To avoid this third-order intermodulation product reducing the receiving sensitivity of the receiver 3, a third-order IM product that may coincide with the receiving frequency must have the lowest possible amplitude. As a result of the intermodulation of the two input signals having frequencies F1 and F2, in addition to the third-order IM product, also other IM products arise on the output of the two-port, among which a second-order IM product having a frequency F1−F2. By means of the external network, this second-order IM product F1−F2 is frequency-selectively fed back to the input of the two-port 2. As a result of the non-linear amplification, the second-order IM product is mixed with the input signal F1, so that a mixed product arises whose frequency is equal to the unwanted third-order IM product having frequency 2*F1−F2.

By means of the frequency-dependent impedances 5 and 6, both the feedback and the phase and amplitude change of the second-order IM product is realized. This change is such that the resulting second-order IM product on the input of the two-port, after being amplified and mixed with the input signal F1, has equal amplitude to the unwanted third-order IM product, but an opposite phase. By addition to the unwanted third-order signal, a reduction of the third-order IM product is achieved.

Not only through the output of the transmitting part 1 can various signals appear on the input of the two-port 2. An external signal coming in via the antenna 4 and intended for the receiving part 3 also ends up on the output of the two-port 2, also connected to the antenna 4. As a result of internal feedback, this external signal appears on the input of the two-port 2.

The input signal coming from the transmitting part 1 and the external signal may from this point onwards be considered two signals available on the input. Hence, the above description is applicable to the input signals obtained in this manner.

Figure 2:
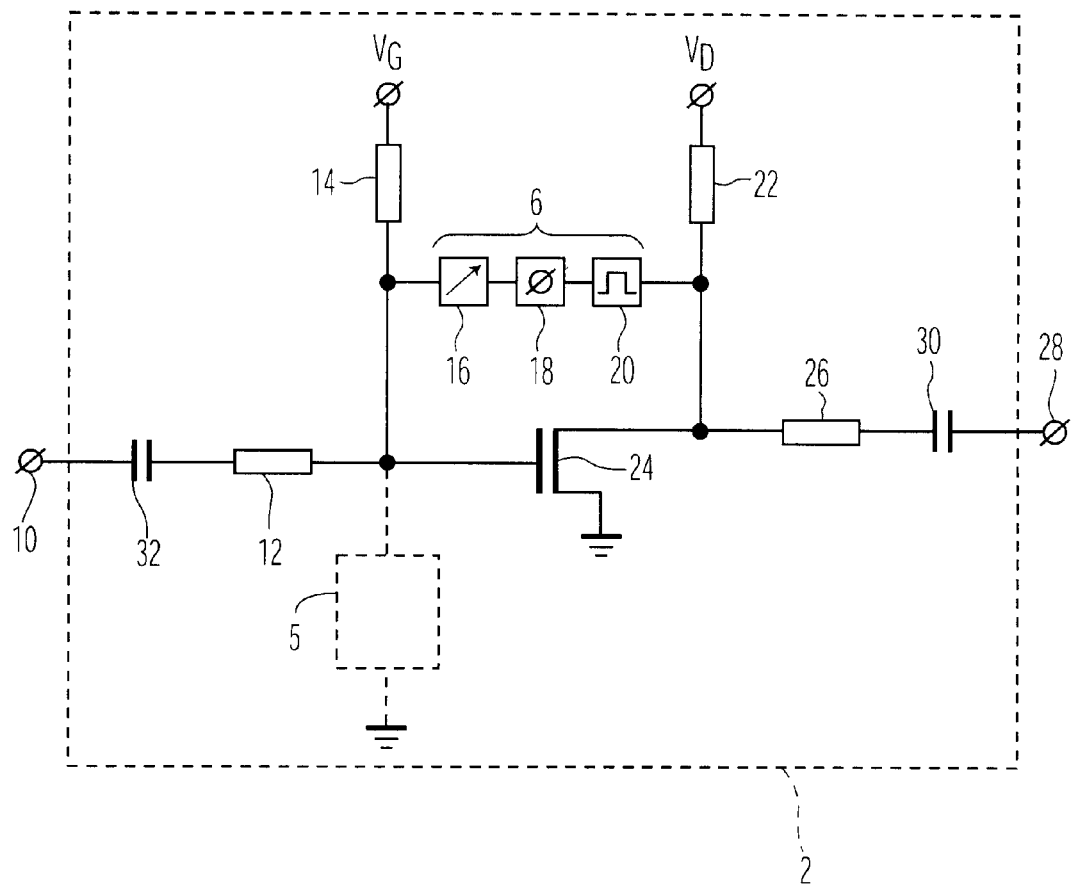
FIG. 2 shows an embodiment of the two-port in the form of an output amplifier.

FIG. 2 shows an embodiment of the two-port 2 according to the invention.

A FET transistor 24 forms in the two-port 2 an amplifying element that has internal feedback and non-linear amplification. The gate of FET transistor 24 is connected to an input 10 via a stripline 12 and a capacitor 32. The stripline 12 has for its purpose to match the general system impedance of input 10 with the input impedance of FET 24, so that reflections and distortion are minimized.

Via a stripline 14 the gate of FET 24 is also connected to a point of fixed potential $V_g$ which provides a correct bias of FET 24. The stripline 14 has substantially no impedance for direct current, so that a stable bias is obtained. By suitably dimensioning the quarter lambda wavelength of the system frequency, the stripline 14 has a high impedance and thus has no influence on the incoming signal of input 10.

Furthermore, the drain terminal of FET 24 is connected to a point of fixed potential via a stripline 22, where a proper dimensioning of the length of the stripline 22 of a quarter lambda provides a low impedance for direct current and a high impedance at the system frequency. Furthermore, the drain of the FET 24 is connected to an output 28 of the two-port 2 by means of a stripline 26 and a capacitor 30. The stripline 26 provides a matching of the output impedance of the FET 24 with the system impedance of the output 28, so that optimum power transfer and minimum reflection and distortion is obtained. The source of FET 24 is connected to a fixed potential voltage, for example ground.

To combat the third-order IM products, the following measures are taken: between the drain and gate of the FET 24 is provided a frequency-selective external feedback in the form of an attenuator 16, a phase shifter 18, and a filter 20.

The filter 20 enables to select the second-order IM product for feedback while other signals available on the drain of the FET 24 are fed back to a lesser extent. An important aspect is that the system frequency, for example the transmitting frequency, is not fed back, as otherwise the total amplification of the system frequency would diminish. The phase and amplitude of the signals allowed to pass through by the filter 20 are then changed by the phase shifter 18 and attenuator 16, so that the feedback signal has a suitable phase and amplitude for the compensation for the third-order IM product. A comparable function to that of impedance 6 can, either or not combined with the impedance 6, be implemented with the aid of the impedance 5 which is connected to the gate of the FET 24 and to a fixed potential voltage, for example, ground. After mixing with the transmitting frequency and amplification, a signal arises that has equal amplitude but opposite phase to the unwanted third-order IM product, so that, after the two signals have been added together, the third-order IM product on the drain of the FET transistor 24 has reduced amplitude.

Figure 3:
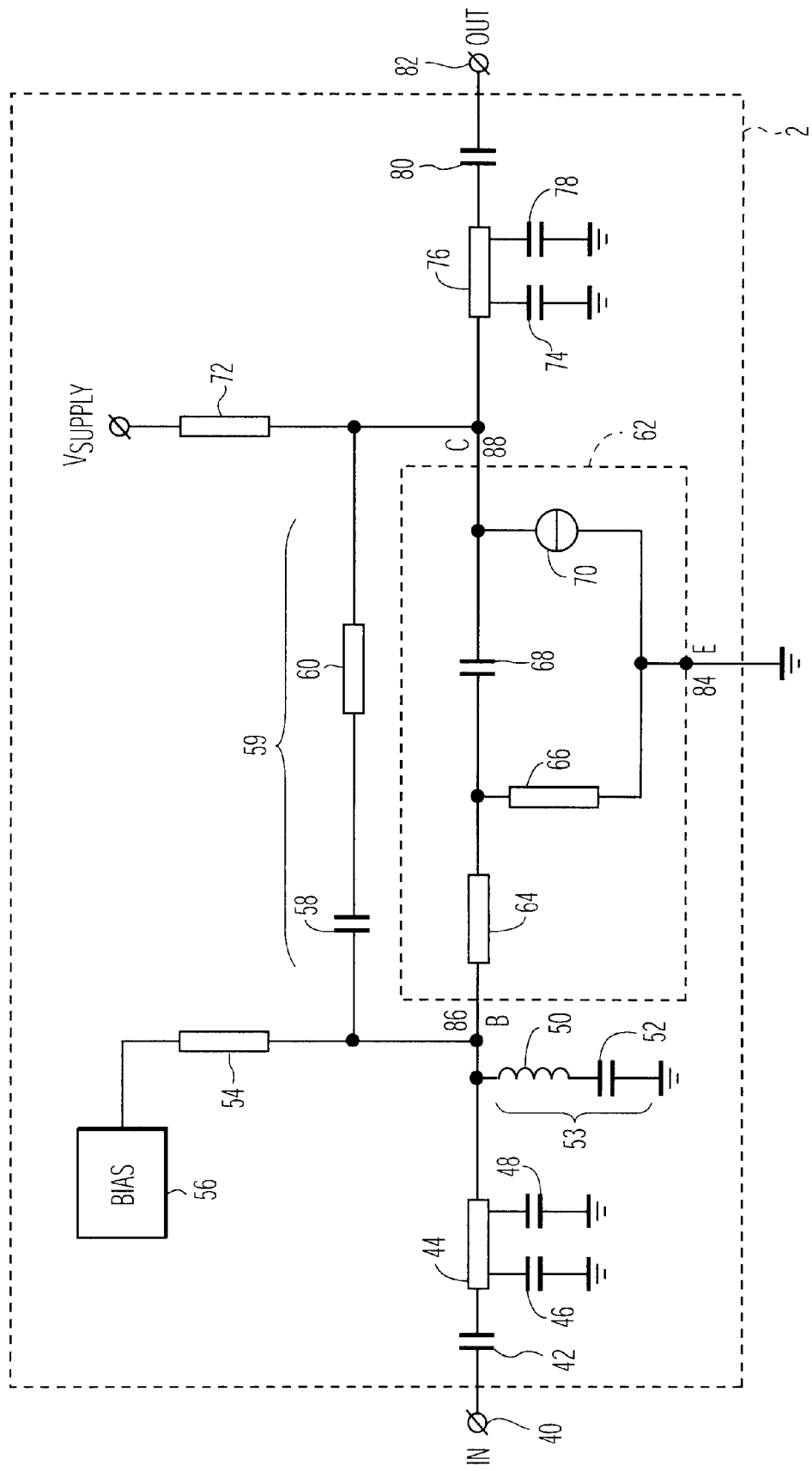
FIG. 3 shows a further embodiment of the two-port in the form of an output amplifier.

FIG. 3 shows a further embodiment of the two-port according to the invention.

A bipolar transistor 62 is represented in this Figure in the form of its π substitute diagram.

In this substitute diagram are included a base resistor 64, a collector-base capacitor 68, a base-emitter resistor 66, a current source 70, a base terminal 86, a collector terminal 88 and an emitter terminal 84 in the configuration customary to the π model.

The bipolar transistor 62 in this two-port forms an amplifier, because the current source 70 produces a current $\beta^*Ir_{be}$, where $Ir_{be}$ is the current through the base-emitter resistor 66. Since the base-emitter resistor 66 is of a non-linear type, the amplification is also non-linear and the amplified signal has unwanted harmonic and intermodulation components.

The base 86 of the bipolar transistor 62 is connected via a stripline 44 to the input 40 of the two-port 2. By means of impedance transformation by the stripline 40 and a capacitor 46 and a further capacitor 48, the input impedance of the base 86 of transistor 62 is adapted to the system impedance of the input 40, so that reflections and distortion are minimized.

The base 86 of transistor 62 is connected to a bias circuit 56 by a stripline 54. Bias circuit 56 provides a correct setting of the base current of the transistor 62. The stripline 54 has a negligible impedance for direct current. At the system frequency the stipline 54 has a high impedance as a result of a suitable dimensioning of a quarter lambda wavelength of the system frequency.

A stripline 72 connects the collector 88 of transistor 62 to a voltage of fixed potential. Having a system frequency wavelength of exactly a quarter lambda, stripline 72 forms a high impedance at this system frequency. For the supply voltage the stripline 72 forms a low impedance. The collector 88 of the transistor 62 is furthermore connected to an output 82 by a stripline 76. The stripline 76, together with the capacitor 74 and a capacitor 78, downconverts the system impedance of the output 82, so that a load impedance suitable for the transistor 62 is obtained.

To combat the third-order IM product, the following measures are taken.

A series circuit 53 comprising a coil 50 and a capacitor 52 is connected between the base 86 of the transistor 62 and a voltage of fixed potential, in which the values of the coil 50 and the capacitor 52 are selected such that, owing to resonance, there is a low impedance at the second-order IM product F1–F2 or, worded differently, with a difference frequency equal to the difference between the transmitting frequency F1 available on the input 40 and an external frequency F2 available on the output 82. The external frequency F2 available on the output 82 of the two-port 2 ends up via the stripline 76 on the collector 88 of the transistor 62 and from there, via the internal feedback by the collector-base capacitance 68, on the non-linear base-emitter resistor 66. Here the unwanted intermodulation products, inter alia 2*F1–F2, arise as a result of intermodulation between the transmitting frequency and the external frequency. Since the series circuit of the coil 50 and the capacitor 52 forms a low impedance at the difference frequency F1–F2, the current in the base-emitter resistor 66 developed as a result of the internal feedback with the resonance at the difference frequency will flow more easily than at other frequencies where the current is to flow to ground through the system impedance on the input 40. The impedance value when the series circuit 53 comprising the coil 50 and the capacitor 52 resonates is thus to be of the same order of magnitude or lower than the system impedance on the input 40 of the two-port 2. The lower limit for the Q factor of the series LC circuit 53 is determined by this impedance value.

Since the current in the base-emitter resistor 66 flows more easily than at other frequencies, and the output current is $\beta*Ir_{be}$, a signal component whose frequency is equal to the resonant frequency F1–F2 of the LC circuit 53 will be also relatively stronger than other signal components on the collector 88 of the transistor 62 in the total signal.

A series circuit comprising a resistor 60 and a capacitor 58 is connected between the collector 88 and the base 86 of the transistor 62. This series circuit establishes an external feedback as a result of which the signal arisen on the collector 88 is fed back to the base 86.

The capacitor 58 blocks the direct current and has such a value that the relatively low frequency difference signal F1 and F2 is affected. The value of the resistor 60 is determined by the necessary feedback of the second-order IM product F1–F2. Since the second-order IM product F1–F2 when compared with the transmitting frequency F1 has been relatively amplified by the measure taken in the form of the series LC circuit 53 on the base 86 of the transistor 62, the feedback of the second-order IM product F1–F2 necessary for the compensation of the third-order IM product 2*F1–F2 is lower. The amplification of the transmitting frequency F1 is affected to a lesser extent.

The feedback signal available on the base 86, including the second-order IM product F1–F2, largely flows to the base 86 of transistor 62, since the input impedance of transistor 62 is lower than the impedance when the LC circuit 53 resonates.

After a correct amplitude and phase shift has been achieved, the feedback second-order IM product F1–F2, together with the transmitting frequency F1 also available on the base, is amplified non-linearly by the transistor 62 while again harmonic and intermodulation products arise. A mixing product F1+(F1–F2) then coincides with the third-order IM product 2*F1–F2 while, when the resistor 60 and the series LC circuit 53 are suitably selected, a signal on the base 86 arises which has the same amplitude but opposite phase, so that the third-order IM product is compensated for. The impedance value of the series LC circuit 53 is to be of the same order of magnitude or higher order than the input impedance of the transistor 62, so that the current developed on the base 86 really flows into the base 86 of the transistor 62. The upper limit for the Q factor of the series LC circuit 53 is determined by this impedance value. The Q factor of the series LC circuit 53 can, as is known, be adjusted with the aid of a resistor included in the series LC circuit 53.

Figure 4:
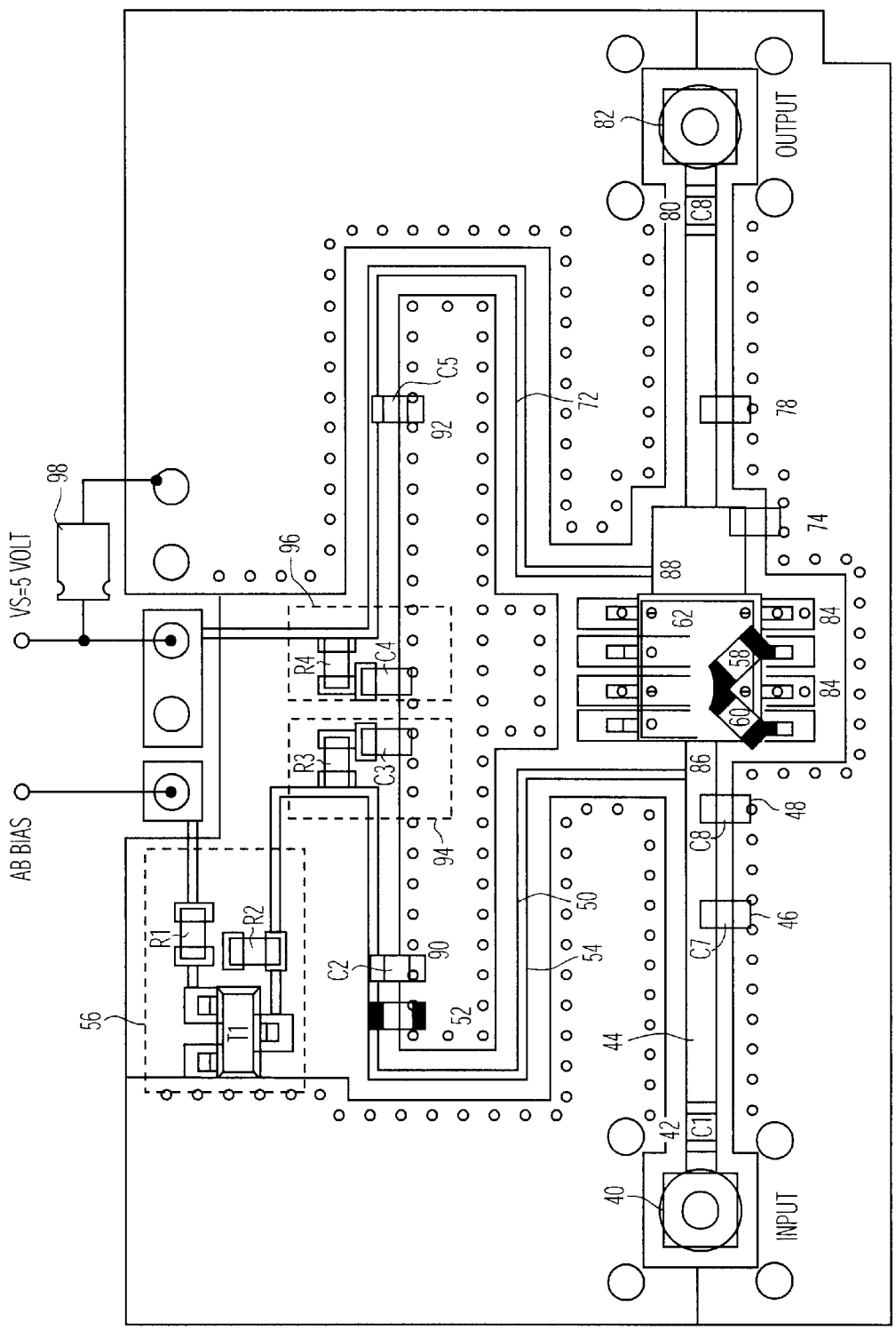
FIG. 4 shows an embodiment of the two-port in stripline technique.

FIG. 4 shows a further embodiment of the two-port according to the invention.

This Figure shows the implementation of the circuit as in FIG. 3, where a further improvement is achieved in that the inductance in the stripline 54 is used to implement the LC circuit 53.

The stripline 54 is terminated at the system frequency by a capacitor 90 which short-circuits the stripline 54 to ground, so that an effective length of a quarter lambda of the system frequency is obtained.

The stripline 54, together with the capacitor 52, further forms a series LC circuit at the frequency of the second-order IM product F1–F2.

For other frequencies the stripline 54 is decoupled by a series RC circuit 94.

Also stripline 72 is decoupled by a series RC circuit 96. A further capacitor 98 is included to decouple the supply voltage for lower frequencies.

What is claimed is:

1. A signal processing system comprising an output circuit that is tuned to a first frequency, an output of which circuit being connected to an input of a two-port having non-linear amplification, and a frequency-selective external network, an output of the two-port being connected to an input of an input circuit that is tuned to a second frequency, characterized in that the external network is tuned to a difference frequency between the first frequency and the second frequency and is connected to the input of the two-port and to the output of the two-port.

2. A signal processing system as claimed in claim 1, characterized in that the two-port comprises an internal feedback.

3. A signal processing system as claimed in claim 1, characterized in that the external network comprises a frequency-dependent impedance between the output of the two-port and the input of the two-port.

4. A signal processing system as claimed in claim 2, characterized in that the external network comprises a frequency-dependent impedance between the input of the two-port and a terminal having reference potential.

5. A signal processing system as claimed in claim 4, characterized in that the two-port comprises a bipolar transistor.

6. A terminal device arranged for processing signals in different frequency channels having a predetermined channel spacing, comprising in succession an output circuit that is tuned to a channel frequency, an output of which circuit being connected to an input of a two-port having non-linear amplification, and a frequency-selective external network, an output of the two-port being connected to an input of an input circuit that is tuned to a second frequency, characterized in that the external network is tuned to a frequency equal to the channel spacing of the signal processing system and comprises a frequency-dependent impedance between the input of the two-port and a terminal having reference potential.

7. A terminal device as claimed in claim 6, characterized in that the two-port comprises an internal feedback.

8. A terminal device as claimed in claim 6, characterized in that the external network comprises a frequency-dependent impedance between the output of the two-port and the input of the two-port.

9. A terminal device as claimed in claim 7, characterized in that the external network comprises a frequency-dependent impedance between the input of the two-port and a terminal having reference potential.

10. A terminal device as claimed in claim 9, characterized in that the two-port comprises a bipolar transistor.

11. A signal processing system comprising:

a two-port having non-linear amplification;

an output circuit that is tuned to a first frequency, an output of which circuit being connected to an input of the two-port;

an input circuit that is tuned to a second frequency, an output of the two-port being connected to an input of the input circuit; and a frequency-selective external network that is tuned to a difference frequency between the first frequency and the second frequency, which external network is connected to the input of the two-port and to the output of the two-port, the external network comprising a frequency-dependent impedance between the output of the two-port and the input of the two-port, and a frequency-dependent impedance between the input of the two-port and a terminal having reference potential.

12. A signal processing system as claimed in claim 11, wherein the input circuit is a receive circuit and the output circuit is a transmit circuit.

13. A signal processing system as claimed in claim 12, wherein the transmit circuit is configured to provide a first signal of the first frequency and a second signal of the second frequency.

14. A signal processing system as claimed in claim 12, wherein the transmit circuit is configured to provide a first signal of the first frequency, and the receive circuit is configured to receive a second signal of the second frequency.

15. A signal processing system as claimed in claim 1, wherein the external circuit is configured to feed back to the input of the two-port network a second-order intermodulation product present at the output of the two-port network, the second order intermodulation product being caused by two signals with the respective first and second frequencies that are present at the input of the two-port network, the fed-back second-order intermodulation product having a phase and an amplitude such that it, after non-linear amplification, causes reduction of a third-order inter modulation product at the output of the two-port network.

16. A signal processing system as claimed in claim 15, wherein a first one of the two signals is produced by the output circuit and a second one of the two signals is a signal intended for the input circuit and fed back to the input of the two-port through internal feedback of the two-port.

17. A signal processing system as claimed in claim 15, wherein the two signals are produced by the output circuit.

* * * * *